(12) United States Patent
Meijer et al.

(10) Patent No.: US 7,454,436 B2
(45) Date of Patent: Nov. 18, 2008

(54) GENERATIONAL GLOBAL NAME TABLE

(75) Inventors: Henricus Johannes Maria Meijer, Mercer Island, WA (US); Anders Hejlsberg, Seattle, WA (US); David L. Remy, Mercer Island, WA (US); Arpan A. Desai, Bothell, WA (US); Asad Jawahar, Woodinville, WA (US); Andrew E. Kimball, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 366 days.

(21) Appl. No.: 11/215,134

(22) Filed: Aug. 30, 2005

(65) Prior Publication Data

US 2007/0061092 A1    Mar. 15, 2007

(51) Int. Cl.
*G06F 17/30* (2006.01)
(52) U.S. Cl. .................. 707/102; 707/103 R; 707/203; 715/234
(58) Field of Classification Search ................. 707/102, 707/103 R, 203; 715/234
See application file for complete search history.

(56) References Cited

U.S. PATENT DOCUMENTS

| | | | | |
|---|---|---|---|---|
| 5,687,361 | A  * | 11/1997 | Sarkar | 707/1 |
| 6,243,720 | B1 * | 6/2001  | Munter et al. | 707/206 |
| 6,457,021 | B1 * | 9/2002  | Berkowitz et al. | 707/201 |
| 2002/0099715 | A1 * | 7/2002 | Jahnke et al. | 707/100 |
| 2002/0116371 | A1 * | 8/2002 | Dodds et al. | 707/3 |
| 2003/0070144 | A1 * | 4/2003 | Schnelle et al. | 715/513 |
| 2003/0172196 | A1 * | 9/2003 | Hejlsberg et al. | 709/328 |
| 2004/0181543 | A1 * | 9/2004 | Wu et al. | 707/102 |
| 2005/0193160 | A1 * | 9/2005 | Bhatt et al. | 711/3 |
| 2006/0053138 | A1 * | 3/2006 | Meijer et al. | 707/101 |

OTHER PUBLICATIONS

".NET Framework Class Library: XmlNameTable Class", 2 pages, accessible at: http://msdn.microsoft.com/library/default.asp?url-/library/en-us/cpref/html/frlrfsystemxmlxmnametableclasstopic.asp, last accessed, Jan. 4, 2006.

".NET Framework Class Library: XmlDocument.CreateElement Method", 2 pages, accessible at: http://msdn.microft.com/library/default.nap?url=/library/en-us/cpref/html/frlrfsystemxmlxmldocumentelasscrasteelementtopic.asp, last accessed, Jan. 4, 2006.

"Interface Document", JAVA 2 Platform, Std. Ed. v1.4.2, 9 pages, accessible at http://java.sun.com/j2se/1.4.2/docs/api/org/w3c/dom/Document.html, last accessed Jan. 4, 2006.

* cited by examiner

*Primary Examiner*—Shahid Alam
*Assistant Examiner*—Phong Nguyen
(74) *Attorney, Agent, or Firm*—Amin, Turocy & Calvin, LLP

(57) ABSTRACT

A system for managing data element names, comprises a parent table for listing names of data elements that is constrained such that the parent table cannot grow beyond a first predetermined size. The system also includes a child table for listing names of data elements that is derived from the parent table and that is constrained such that the child table cannot grow beyond a second predetermined size. Methods for using the system are also provided.

11 Claims, 12 Drawing Sheets

GENERATIONAL GLOBAL NAME TABLE

BACKGROUND

Data processing tasks commonly occur in highly distributed environments and across diverse heterogeneous computing platforms and data processing applications. The growth in popularity of the Internet and the proliferation of web sites performing a wide variety of data processing tasks has only exacerbated this situation. Correspondingly, a great need to not only format data but to communicate that format to computing systems in a platform- or application-neutral manner quickly arose. To address this need, documents created and using the extensible markup language (XML) family of specifications became an unofficial standard for data communications across networked machines.

A great strength of XML is its use of tags to describe and structure data included in a document. The use of these descriptive tags makes XML a self-documenting data format. However, a common drawback associated with the use of tags is the challenge of converting data from an XML document into a data structure that efficiently stores the data in memory. Part of this challenge stems from the fact that a typical XML document is both verbose and redundant. A great deal of redundancy stems from the fact that well-formed XML code includes both opening and closing tags. Additionally, names of tagged elements can often be repeated as multiple instances of enclosing elements occur throughout an XML document.

One common approach to dealing with this drawback is to create a data structure in memory to store unique names of tagged XML elements. This data structure is typically called an XML name table, or simply a name table. Use of an XML name table can greatly speed processing and reduce computational overhead. Use of a global XML name table that stores unique names of tagged XML elements across more than one XML document can provide similar benefits.

A drawback of current name tables is their size. In computational environments where more than one XML document is used, the size of a traditional XML name table can grow prohibitively large because the global XML name table must track every unique name included in each and every XML document used by the computing system. Current systems lack efficient means to manage growth of a global XML name table. Additionally, contemporary systems lack effective ways to purge unused or infrequently used names from the global XML name table.

SUMMARY

The following presents a simplified summary in order to provide a basic understanding and high-level survey. This summary is not an extensive overview. It is neither intended to identify key or critical elements nor to delineate scope. The sole purpose of this summary is to present some concepts in a simplified form as a prelude to the more detailed description later presented. Additionally, section headings used herein are provided merely for convenience and should not be taken as limiting in any way.

A generational global name table can store unique names of elements from XML documents. The generational global name table is space-constrained such that it cannot grow beyond a specified size. When the generational global name table reaches its capacity, a next-generation global name table is created with additional capacity. This scheme permits efficient management of the growth of the generational global name table.

A generational global name table includes generation identifiers associated with unique names included in the table. When a next-generation table is created, active entries from the previous generation can be migrated to the current generation name table. The generation identifiers permit ready identification of inactive name entries. Inactive name entries can be removed to conserve space. Additionally, with previous generation name tables, removal of a last active entry can permit removal of the entire table, leaving a current name table.

The disclosed and described components and methods comprise one or more of the features hereinafter described and particularly pointed out in the claims. The following description and the annexed drawings set forth in detail certain specific illustrative components and methods. However, these components and methods are indicative of but a few of the various ways in which the disclosed components and methods can be employed. Specific implementations of the disclosed and described components and methods can include some, many, or all of such components and methods, as well as their equivalents. Variations of the specific implementations and examples presented herein will become apparent from the following detailed description when considered in conjunction with the drawings.

DETAILED DESCRIPTION

Figure 1:
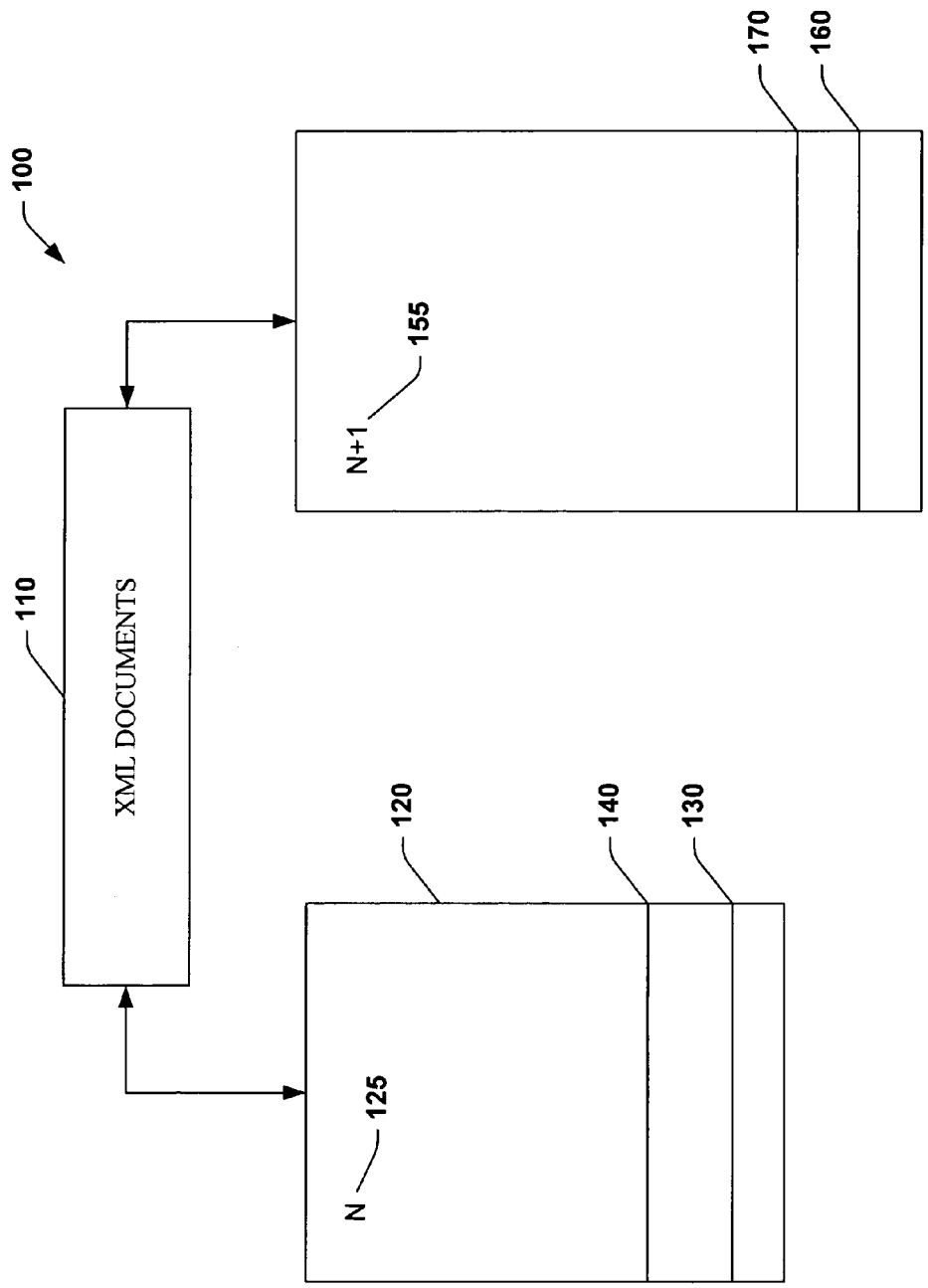
FIG. 1 is a system block diagram of a generational global XML name table system.

As used in this application, the terms "component," "system," "module," and the like are intended to refer to a computer-related entity, such as hardware, software (for instance, in execution), and/or firmware. For example, a component can be a process running on a processor, a processor, an object, an executable, a program, and/or a computer. Also, both an application running on a server and the server can be components. One or more components can reside within a process and a component can be localized on one computer and/or distributed between two or more computers.

Disclosed components and methods are described with reference to the drawings, wherein like reference numerals are used to refer to like elements throughout. In the following description, for purposes of explanation, numerous specific details are set forth in order to provide a thorough understanding of the disclosed subject matter. It may be evident, however, that certain of these specific details can be omitted or combined with others in a specific implementation. In other instances, certain structures and devices are shown in block diagram form in order to facilitate description. Additionally, although specific examples set forth may use terminology that is consistent with client/server architectures or may even be examples of client/server implementations, skilled artisans will appreciate that the roles of client and server may be reversed, that the disclosed and described components and methods are not limited to client/server architectures and may be readily adapted for use in other architectures, specifically including peer-to-peer (P2P) architectures, without departing from the spirit or scope of the disclosed and described components and methods. Further, it should be noted that although specific examples presented herein include or reference specific components, an implementation of the components and methods disclosed and described herein is not necessarily limited to those specific components and can be employed in other contexts as well.

It should also be appreciated that although specific examples presented may describe or depict systems or methods that are based upon components of personal computers, the use of components and methods disclosed and described herein is not limited to that domain. For example, the disclosed and described components and methods can be used in a distributed or network computing environment. Additionally or alternatively, the disclosed and described components and methods can be used on a single server accessed by multiple clients. Those of ordinary skill in the art will readily recognize that the disclosed and described components and methods can be used to create other components and execute other methods on a wide variety of computing devices.

FIG. 1 is a system block diagram of a generational global XML name table system 100. The generational global XML name table system 100 can be used to efficiently store unique tag or element names from one or more XML-formatted documents. Specifically, the generational global XML name table system 100 can be used to manage growth of a global XML name table such that computational efficiencies provided by using a global XML name table are not outweighed by computational overhead resulting from managing the global XML name table.

The generational global XML name table system 100 includes a group of XML documents 110. The group of XML documents 110 can be gathered from a variety of sources and can all share the same structure or can have differing structures. As used in this document, a structure of an XML document includes names of tags as well as an arrangement of such tags. Included in the concept of a tag, as appropriate in a specific context, are attributes of elements defined by a tag.

Each document in the group of XML documents 110 can be scanned, parsed, or otherwise analyzed or evaluated to obtain a set of unique tag names for inclusion in a global XML name table. For XML documents that are created in accordance with the official XML specification, tag or element names are case sensitive. Therefore, the name of MyElement is different from myElement and both are different from MYELEMENT. Documents containing these three variants of the MyElement name will result in three different entries in a global XML name table, even though all three names can refer to similar data.

A first generation name table 120 can include a set of unique tag or element names that are obtained from individual documents in the group of XML documents 110. The first generation name table 120 can include a generation indication value 125. The generation indication value 125 can serve as a designator of a version of the name table. Although referred to as a first generation name table, in this context the label "first" simply indicates a base point of reference for discussion. The first generation name table 120 can in fact be a second, third, or greater generation table.

A size constraint 130 and a threshold 140 can also be included in the first generation name table 120. The size constraint 130 can be a value that represents a maximum number of entries that are allowed to be included in the first generation name table 120. This size constraint 130 is set to ensure that the first generation name table 120 does not acquire so many entries as to become unwieldy or inefficient to process or store in memory. The value of the size constraint can be set to an initial value that is sufficient to store all unique names from XML documents currently included in the group of XML documents 110. When all available entries in the first generation name table 120 are filled or close to being filled, a next generation name table, such as second generation name table 150, can be created to provide additional storage space. The threshold value 140 can be set at a value below the size constraint 130 to provide an indication that capacity of the first generation name table 120 is being approached.

The second generation name table 150 can be created when the threshold 140 of the first generation name table 120 is reached. Alternatively, creation of the second generation name table 150 can be deferred until the size constraint 130 of the first generation name table 120 is reached and the first generation name table 120 has been filled to its capacity. The second generation name table 150 can include all the names from the first generation name table 120 as well as available spaces for newly acquired names. A generation indicator 155 can be used to identify a version or generation of the second generation name table 150.

A size constraint 160 and a threshold 170 are also included in the second generation name table 150. The size constraint 160 and the threshold 170 of the second generation name table 150 are analogous to the size constraint 130 and the threshold 140 of the first generation name table 120, respectively. Additionally, the size constraint 160 and the threshold 170 of the second generation name table 150 can be used in a similar manner as the use of the size constraint 130 and the threshold 140 of the first generation name table 120 respectively.

Values of the size constraint 160 and the threshold 170 of the second generation name table 150 can be calculated from values of the size constraint 130 and the threshold 140 of the first generation name table 120, respectively. One possible manner of calculating the value of the size constraint 160 is to take the value of the size constraint 130 and add a constant amount to obtain a sum that can be assigned as the value of the size constraint 160. Other methods of calculating a value for the size constraint 160 include increasing the value of the size constraint 130 by a specified percentage, multiplying the value of the size constraint 130 by a specified amount, or applying a growth factor to the value of the size constraint 130. Other calculation methods, including more complex algorithmic methods, can also be used as desired or appropriate for a specific implementation.

A value to be assigned to the threshold 170 can be calculated by applying the same method of calculation used to determine the value to be applied to the size constraint 160 to the threshold 140. Alternatively, the threshold 170 can be calculated as a percentage of the size constraint 160. This percentage can be adjusted as successive generations of name tables are created. The threshold 170 can also be set as the difference between the value of the size constraint 160 and some constant value. Other calculation methods can also be used as desired or appropriate for a specific implementation.

In operation, the generational global XML name table system 100 can function as follows. The first generation name table 110 is created using an initial value for the size constraint 130. This initial value for the size constraint 130 can represent a maximum number of entries that can be filled before a new name table generation is spawned. Initially, the value for the size constraint 130 can be an arbitrary value that is determined to strike a balance between the available size of the first generation name table 110 and the processing overhead inherent in the creation of a next generation name table. In this example, an initial value for the size constraint 130 can be 10.

As new XML names are discovered in the group of XML documents 110, those names are added to the first generation name table 120. A generation identifier that corresponds to the generation identifier 125 can be stored with the unique name in addition to an identifier used to locate the unique name in the first generation name table 120. When XML Names are compared with each other the generation identifier of the unique name can be used.

When the size constraint 130 is reached the second generation name table 150 is created. The size of the second generation name table 150 can be greater than the size of the first generation name table 120 that has grown beyond its threshold. It is possible that the working set of unique names is larger than the size of the current name table, for example, when working with a large XML document with a large number of unique names. In this case, if the second generation name table 150 was created to be the same size as the first generation name table 120, thrashing would occur such that the newly created second generation name table 150 would immediately fill to capacity, causing creation of a next generation name table, which in turn would immediately fill, and so forth for successive generations. In this example the size constraint 160 of the second generation name table 150 is 50% larger than the size constraint 130 of the first generation name table 120, thus setting the value of the size constraint 160 at 15. If another generation were to be required in this example the value would be revised from 15 to 23.

Figure 2:
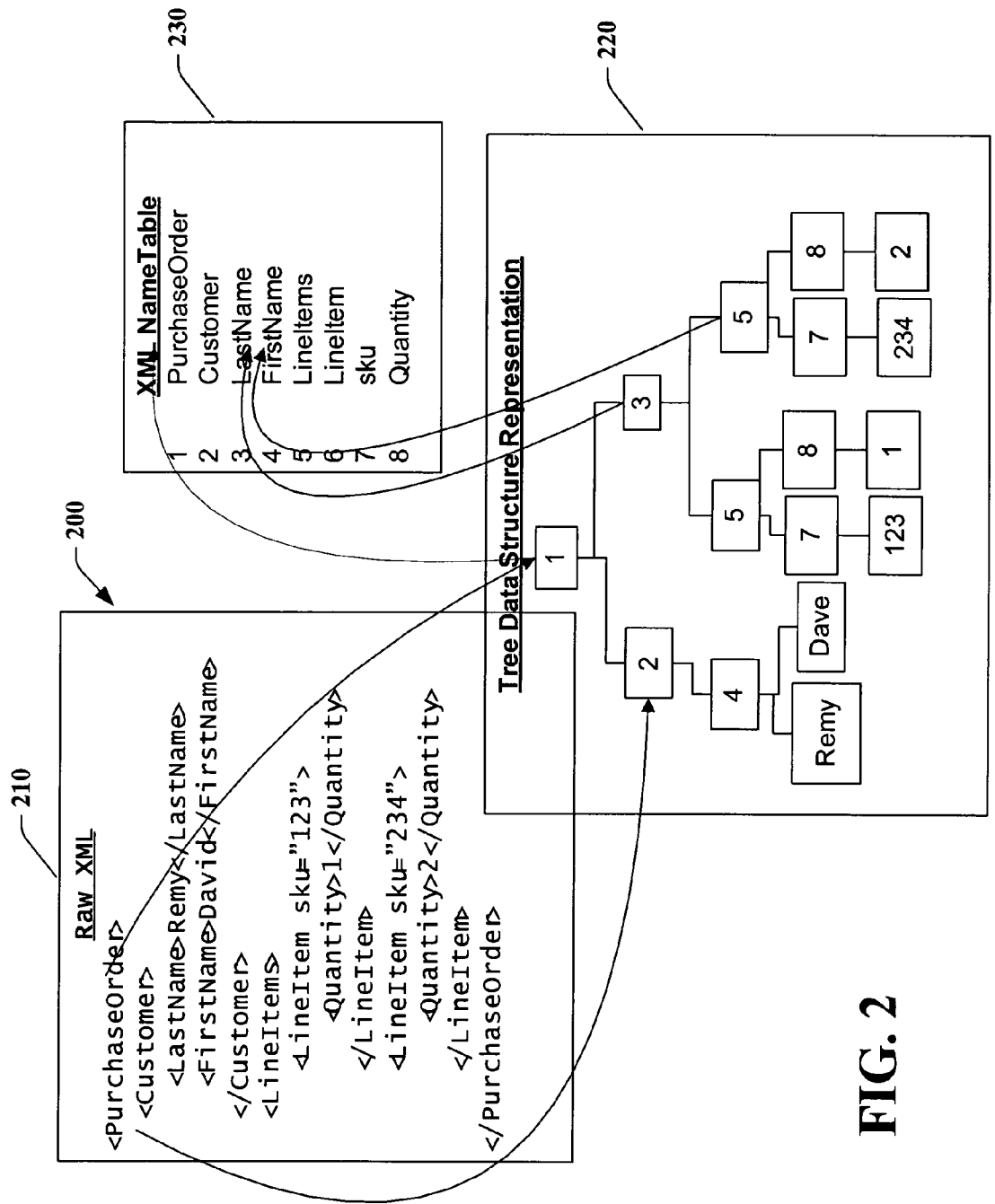
FIG. 2 is a system block diagram of an XML name table system.

FIG. 2 is a system block diagram of an XML name table system 200. The XML name table system 200 can be used to create a name table from a raw XML document. Specifically, the XML name table system 200 can be used to populate a generational XML name table, such as one of the generational name tables previously disclosed or described in conjunction with FIG. 1.

The XML name table system 200 includes a segment of raw XML 210. This segment of raw XML 210 can be obtained from a well-formed XML document. The segment of raw XML 210 includes a group of elements and sub-elements, both with and without attributes. These elements and sub-elements can be defined by opening and closing tags that include unique names.

A tree data structure 220 can be created from the segment of raw XML 210. The tree data structure 220 provides an alternate format for storing data from the segment of raw XML 210 in memory. Each element of the segment of raw XML 210 can be represented as a node in the tree data structure 220. Sub-elements can be represented as child nodes and data can be represented in leaves. Each node of the tree data structure 220 can be named using names of tags from the segment of raw XML 210 that defined the node. Each of these names can be stored as an entry in an XML name table 230.

In addition to saving space in the tree data structure 220 that holds the XML representation, an XML name table can also dramatically increase the processing speed of comparing names. String comparison, such as comparing two names character by character, is generally a slow operation. Character-by-character comparisons have an algorithmic running time of O(N). When using an XML name table, this running time can be greatly reduced. Instead of performing a character-by-character name comparison, it is possible to do an equality comparison using the identifier of the tag in the XML name table instead of performing a string comparison. An equality comparison has an algorithmic running time of O(1), which is a dramatic improvement over an O(N) algorithm.

Figure 3:
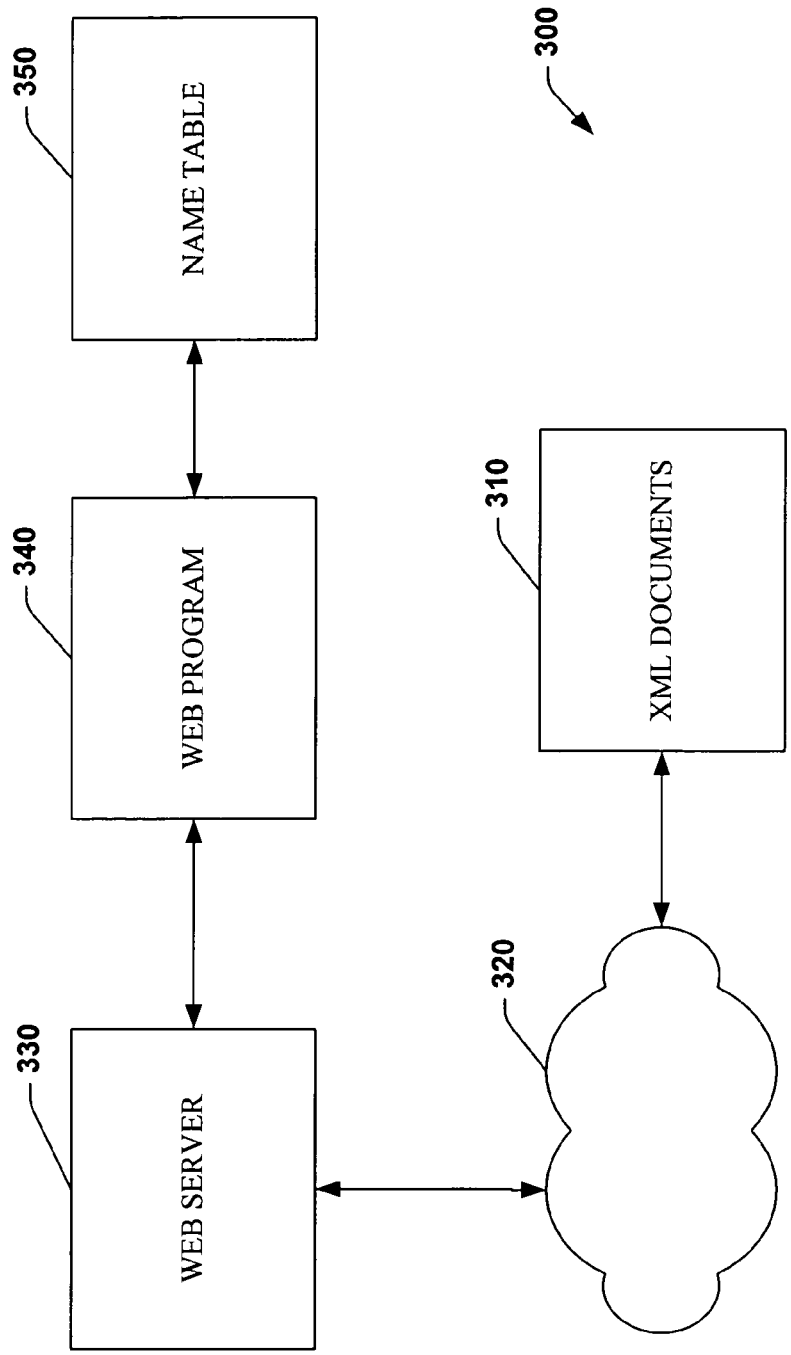
FIG. 3 is a system block diagram of a data processing system that uses a generational XML name table.

FIG. 3 is a system block diagram of a data processing system 300 that uses a generational XML name table to manage data from a group of XML documents. The data processing system 300 can efficiently manage tracking of names of data elements from the group of XML documents through use of the generational XML name table. Additionally, the data processing system 300 can efficiently manage growth of the generational name table to manage processing overhead associated with data processing tasks. In this specific example, a system based upon a world wide web implementation is presented. It should be noted that a web-based system is only one possible implementation and that other implementations that do not access either the world wide web or the Internet are possible.

The data processing system 300 includes a group of XML documents 310. The group of XML documents can be received over a network 320. The network 320 can be the world wide web, the Internet, an intranet, a local area network (LAN), a wide area network (WAN), a wireless network such as a code division multiple access (CDMA) network, a time division multiple access (TDMA) network, a global service for mobile communication (GSM) network, or another suitable network.

A web server 330 can receive the group of XML documents 310 from the network 320. The web server 330 can provide a set of communication-based functions such as responding to information requests and providing file transfer abilities using a variety of communication protocols. Commonly used protocols include, but are not limited to, the hypertext transfer protocol (HTTP) and the file transfer protocol (FTP). Additionally or alternatively, a non-standard or proprietary protocol can be employed.

The web server 330 can also provide an execution platform for a web program 340. The web program 340 can be any suitable executable application that performs one or more desired functions. In the context of this example, one of the functions provided by the web program 340 is the analysis of XML documents received by the web server 330 to identify unique names of XML tagged elements. The web program 340 stores each identified unique name in a generational global XML name table 350. The generational global XML name table can be implemented as described previously in conjunction with other figures.

In operation, the data processing system can function as follows. One or more XML documents, such as the group of XML documents 310, is transmitted over the network 320 to the web server 330. The web server 330 receives the group of XML documents 310 from the network 320 and provides the web program 340 access to the group of XML documents 310. The web program 340 analyzes each document in the group of XML documents 310 to identify unique element or tag names. When the web program 340 identifies a unique name, it checks the generational global XML name table 350 to determine whether the unique name is already included in the generational global XML name table 350. If not, the web program 340 adds the unique name to the generational global XML name table 350.

Figure 4:
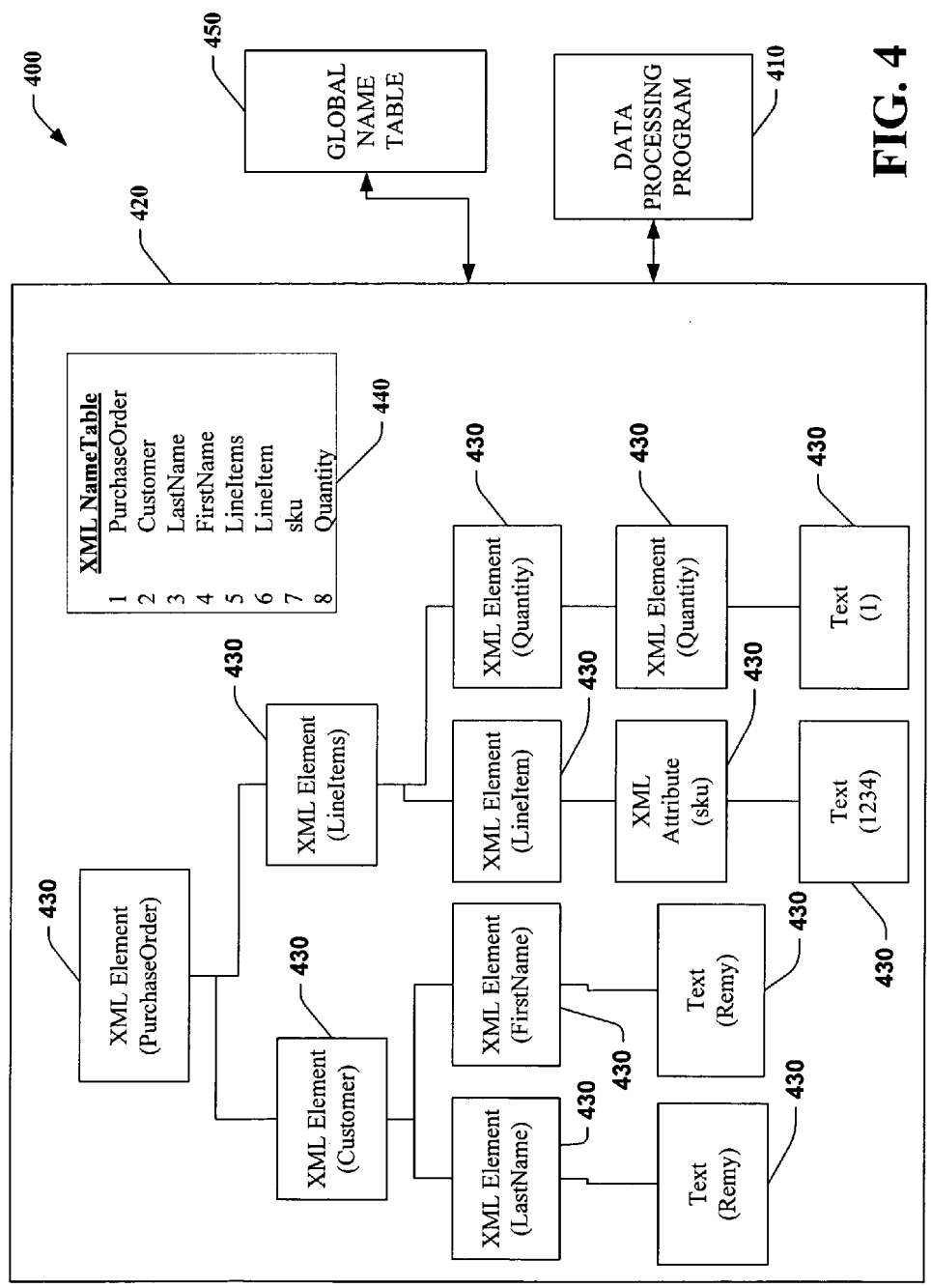
FIG. 4 is a system block diagram of a data processing system 400 that uses an XML document with an included XML name table.

FIG. 4 is a system block diagram of a data processing system 400 that uses an XML document with an included XML name table. The data processing system 400 can use the XML name table of the XML document to populate entries in a generational global XML name table. Such use of a name table can greatly reduce processing overhead to populate a generational global XML name table by eliminating the need to scan, parse, or otherwise analyze the XML document to identify unique names.

The data processing system 400 includes a data processing program 410 that can access an XML document 420. The XML document 420 can contain a plurality of elements 430. Each element of the plurality of elements 430 can have a unique name. Alternatively, some or all of the names of each of the plurality elements 430 can be repeated. A XML name table 440 can include a list of unique element names. The XML name table 440 can be accessed by the data processing program 410. Contents of the XML name table 440 can be used by the data processing program 410 to populate entries in a generational global XML name table 450.

In operation, the data processing system 400 can function as follows. The data processing program 410 accesses the XML document 420. As part of such access, the data processing program 410 locates the XML name table 440 of the XML document 420. The data processing program 410 compares each entry of the XML name table 440 with entries of the generational global XML name table 450. If an entry from the XML name table 440 is not already included in the generational global XML name table 450, the data processing program 410 inserts the missing entry from the XML name table 440 as a new entry in the generational global XML name table 450.

Figure 5:
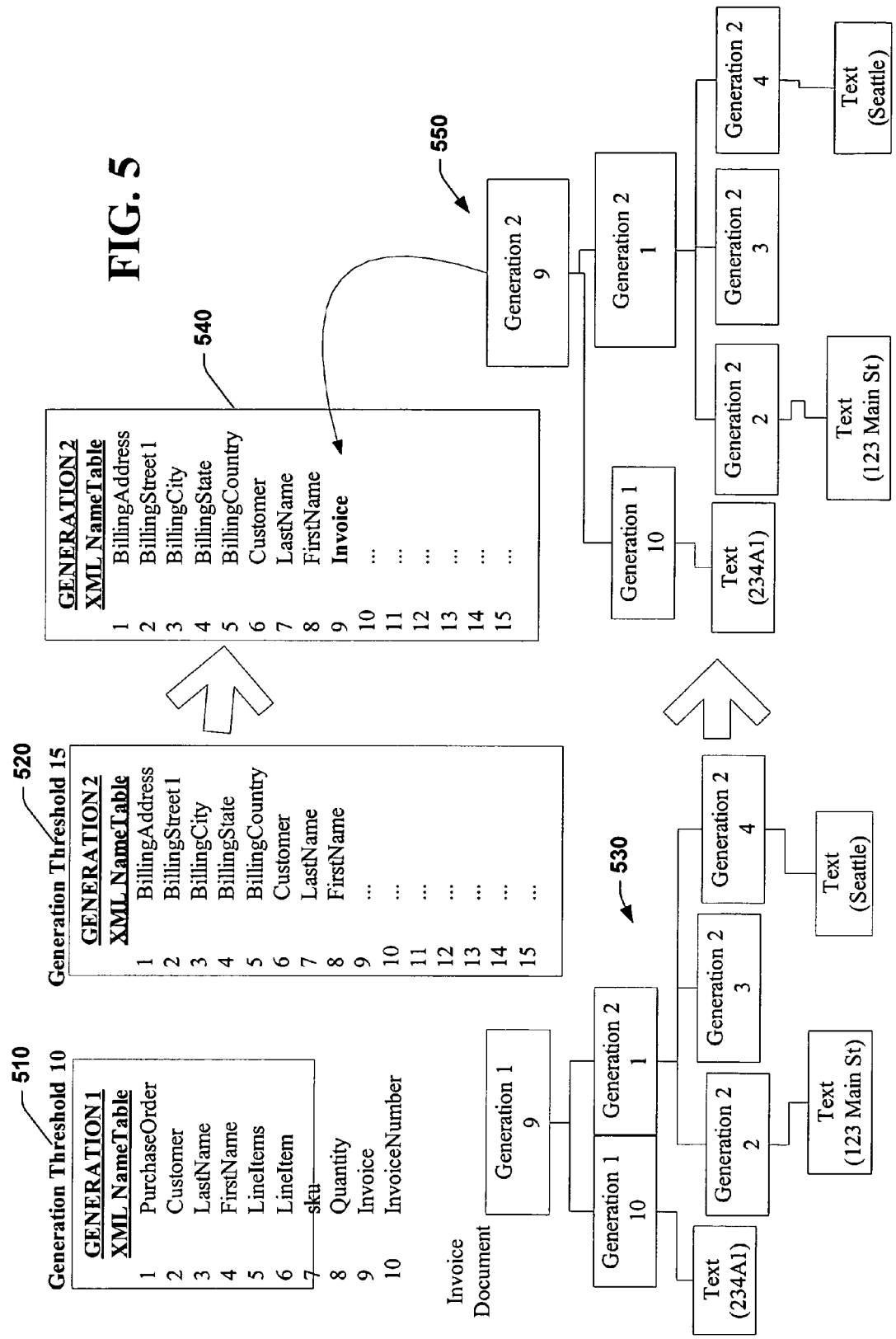
FIG. 5 is a block diagram depicting migration of entries to a next-generation global XML name table.

FIG. 5 is a block diagram depicting migration of entries to a next-generation global XML name table. Such migration of entries can be used to populate entries in a next-generation global XML name table without having to analyze source XML documents again. Additionally, entry migration can be used to release space taken up by entries that are no longer in use by the computing system.

Once a next-generation name table is created, there are two types of XML name entries in the previous generation XML name table. Those types include entries that have become inactive, meaning that the objects that are referring to them have either been garbage collected or will soon be garbage collected, or entries that are active and need to be migrated to the new next-generation XML name table. In the former case, no action is needed because the previous generation XML name table as a whole will be garbage collected once remaining active entries are removed because there will be no active objects holding the previous generation XML name table in existence. In the latter case, a mechanism for migrating active XML names to the next generation XML name table is needed.

This migration can be accomplished by comparing a generation identifier of XML names that are encountered (for example, when doing a comparison) with the current XML name table generation identifier. If values of these two identifiers differ, the encountered XML name can be updated using the process that is used to insert a new XML name into the table. Specifically, the unique XML name can be looked up in the current generation XML name table. If the name is already present, record the XML name table identifier. If not already present, add the name to the table and record its identifier.

A first generation name table 510 includes a group of entries for unique names of XML elements. When the first generation name table 510 reaches its capacity, a second generation name table 520 is created. Entries in the second generation XML name table 520 are populated with unique names of XML tagged elements. A data structure 530 provides information regarding generation identifiers so that such identifiers from the data structure 530 can be compared with a generation identifier of the current generation global XML name table 520.

If the generation identifier from the data structure 530 does not match the generation identifier of the current second generation global XML name table 520, an entry is created in the current second generation global XML name table 520 with the correct generation identifier. In this example, that entry is entry number 9 of an updated current second generation global XML name table 540. The data structure 530 can be updated to reflect the updated generation identification information as depicted by data structure 550.

With reference to FIGS. 6-9, flowcharts in accordance with various methods or procedures are presented. While, for purposes of simplicity of explanation, the one or more methodologies shown herein, for example, in the form of a flow chart, are shown and described as a series of acts, it is to be understood and appreciated that neither the illustrated and described methods and procedures nor any components with which such methods or procedures can be used are necessarily limited by the order of acts, as some acts may occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology or procedure.

Figure 6:
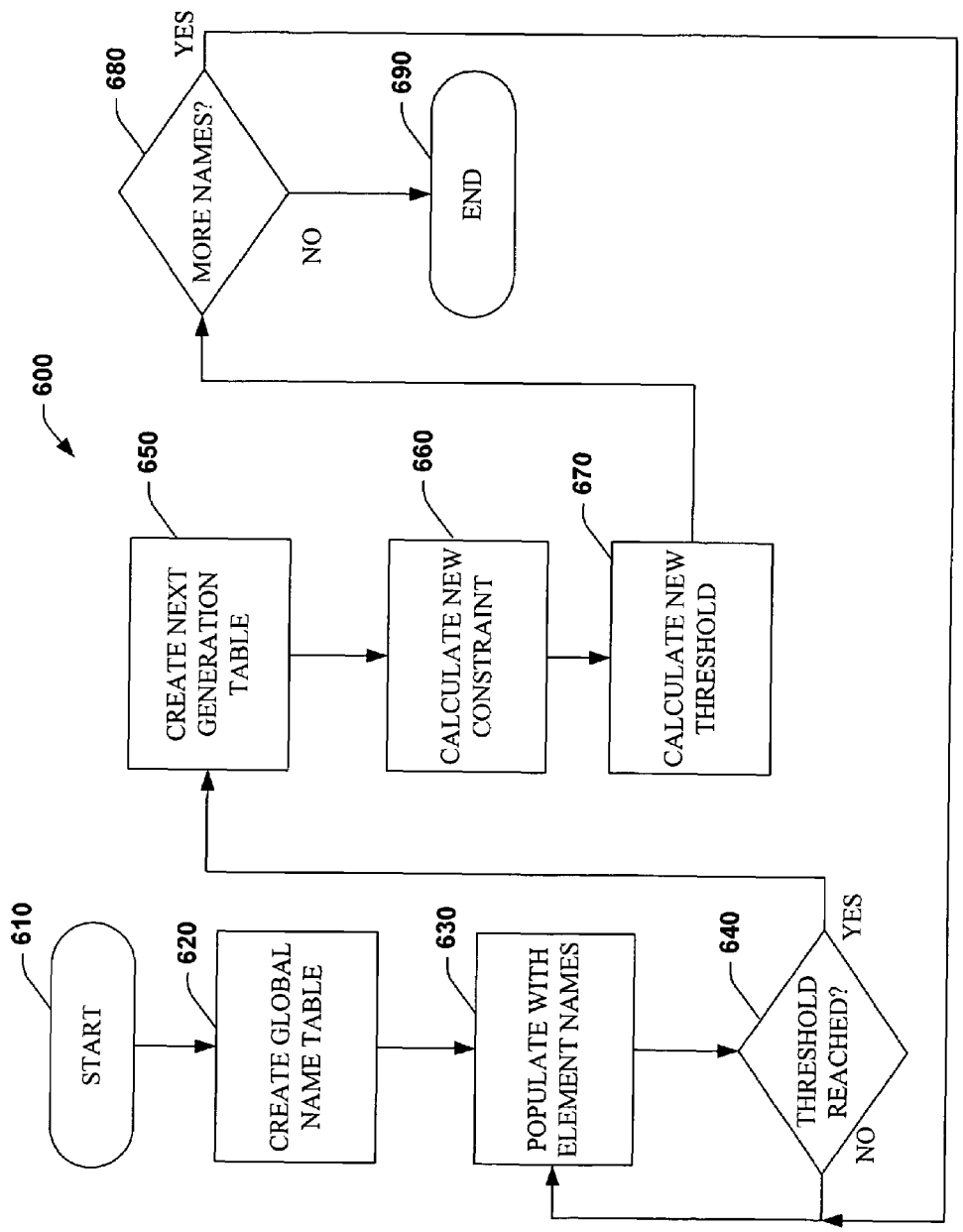
FIG. 6 is a flow diagram depicting a general processing flow of a method that can be employed in accordance with components that are disclosed and described herein.

FIG. 6 is a flow diagram of a method 600 that can be used in conjunction with various components that have been disclosed or described herein. The method 600 can be used to create a generational global XML name table. Specifically, the method 600 can be used to create a next-generation global XML name table when a previous-generation global XML name table has reached its capacity.

Processing of the method 600 begins at START block 610 and continues to process block 620. At process block 620, a first generation global XML name table is created. This creation can occur with various parameters for the a first generation global XML name table as previously disclosed or described in conjunction with other figures. Processing continues to process block 630 where entries in the first generation global XML name table are populated with names of XML elements obtained from XML documents.

Processing of the method 600 continues to decision block 640 where a determination is made whether a size threshold of the first generation global XML name table has been reached. If this determination is no, processing returns to process block 630. If the determination made at decision block 640 is yes, processing continues to process block 650. At process block 650, a next-generation global XML name table is created. Processing continues to process block 660 where a new size constraint to be applied to the next-generation global XML name table is calculated. Such calculation can be in accordance with any of the techniques previously discussed in conjunction with other figures.

At process block 670, a new threshold to be applied to the next-generation global XML name table is calculated. Such calculation can be in accordance with any of the techniques previously discussed in conjunction with other figures. Processing continues from process block 670 to decision block 680. At decision block 680, a determination is made whether there are more names available to include in entries of the next-generation global XML name table. If this determination is yes, processing of the method 600 returns to process block 630. If the determination made at decision block 680 is no, processing concludes at END block 690.

Figure 7:
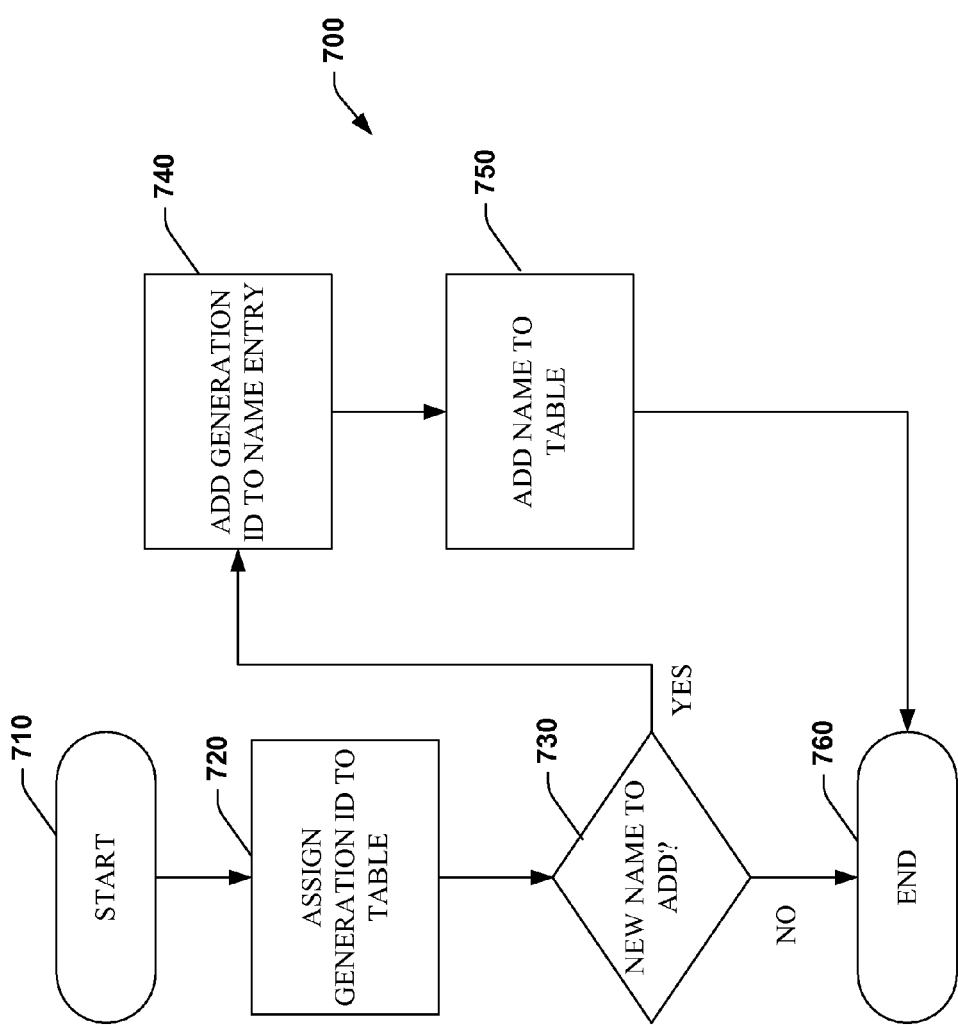
FIG. 7 is a flow diagram depicting a general processing flow of a method that can be employed in accordance with components that are disclosed and described herein.

FIG. 7 is a flow diagram of a method 700 that can be used in conjunction with various components that have been disclosed or described herein. The method 700 can be used to manage generation identifiers for use with a generational global XML name table. Specifically, the method 700 can be used to update a generation identifier associated with a unique name to preserve the unique name in a next-generation global XML name table.

Processing of the method 700 begins at START block 710. From START block 710 processing continues to process block 720 where a generation identifier is assigned to a currently-active generational global XML name table. Processing continues to decision block 730 where a determination is made whether a new unique name of an XML element is to be added to the currently-active generational global XML name table. If this determination is yes, processing continues to process block 740.

At process block 740, a generation identifier that matches the generation identifier of the currently-active generational global XML name table is associated with the unique name of the XML element being added to the currently-active generational global XML name table. Processing continues to process block 750 where the unique name of the XML element is added as an entry in the currently-active generational global XML name table. Processing from process block 750 concludes at END block 760. Similarly, if the determination made at decision block 730 is no, processing concludes at END block 760.

Figure 8:
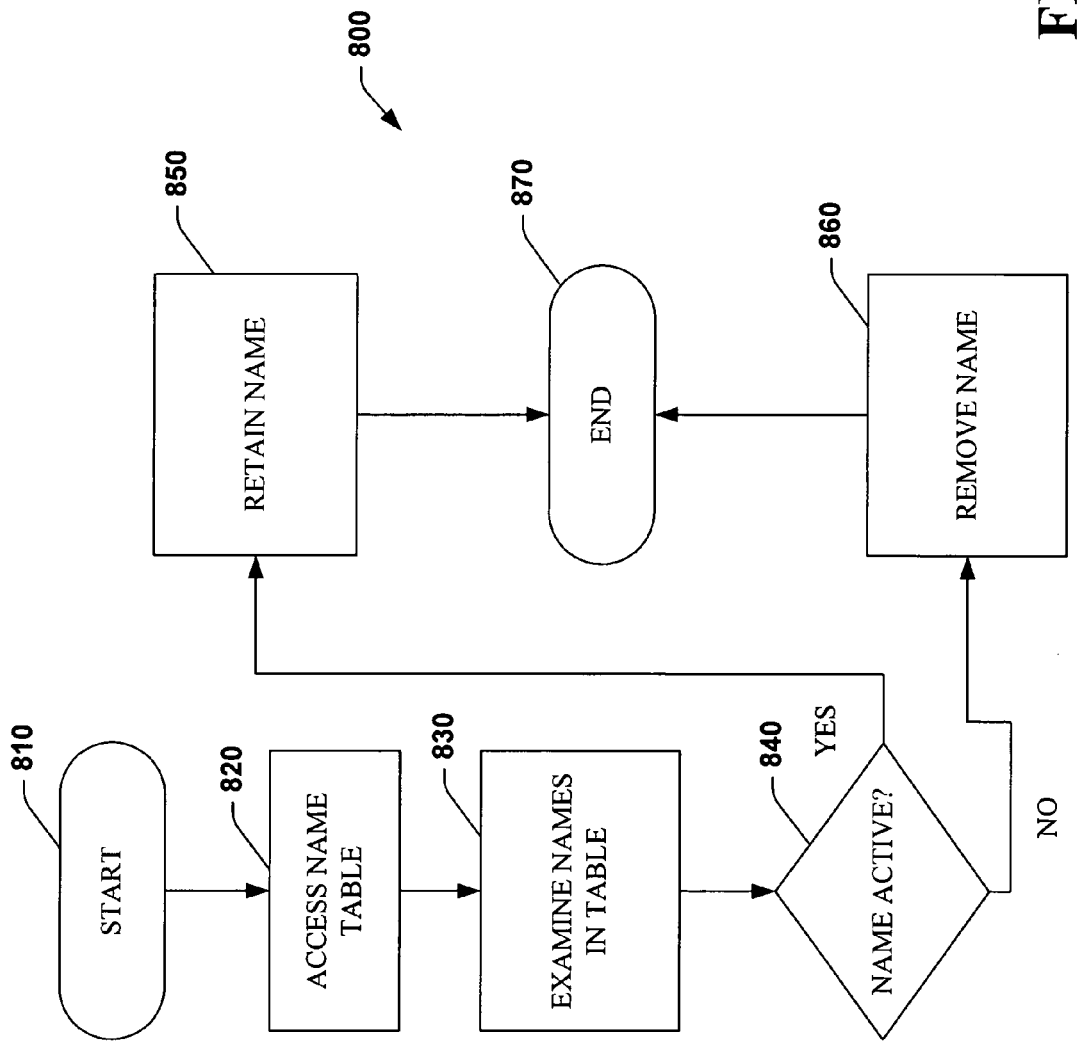
FIG. 8 is a flow diagram depicting a general processing flow of a method that can be employed in accordance with components that are disclosed and described herein.

FIG. 8 is a flow diagram of a method 800 that can be used in conjunction with various components that have been disclosed or described herein. The method 800 can be used to manage entries in a generational global XML name table. Specifically, the method 800 can be used to retain or remove entries in a generational global XML name table.

Processing of the method 800 begins at START block 810 and continues to process block 820. At process block 820, a current generational global XML name table is accessed. Processing continues from process block 820 to process block 830 where unique names included in entries of the current generational global XML name table are examined. At decision block 840, a determination is made whether a unique name is still active. If this determination is yes, processing continues to process block 850 where the name is retained. If the determination made at decision block 840 is no, processing continues to process block 860 where the name is removed from the current generational global XML name table. Processing from either process block 850 or process block 860 concludes at END block 870.

Figure 9:
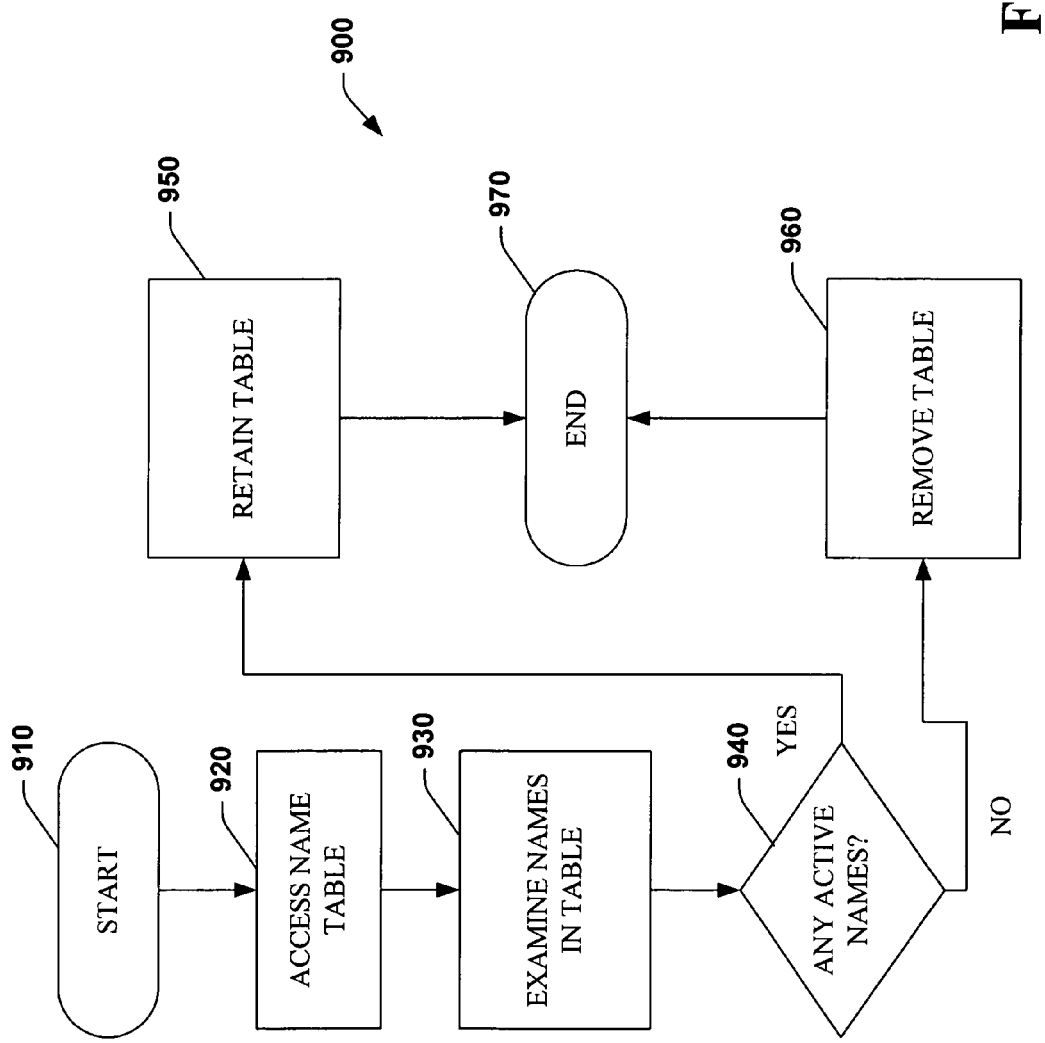
FIG. 9 is a flow diagram depicting a general processing flow of a method that can be employed in accordance with components that are disclosed and described herein.

FIG. 9 is a flow diagram of a method 900 that can be used in conjunction with various components that have been disclosed or described herein. The method 900 can be used to manage a generational global XML name table. Specifically, the method 900 can be used to retain or remove the generational global XML name table from use in the computing system.

Processing of the method 900 begins at START block 910 and continues to process block 920. At process block 920, a generational global XML name table is accessed. Processing continues from process block 920 to process block 930 where unique names included in entries of the generational global XML name table are examined. At decision block 940, a determination is made whether any entries in the generational global XML name table are still active. If this determination is yes, processing continues to process block 950 where the generational global XML name table is retained. If the determination made at decision block 940 is no, processing continues to process block 960 where the generational global XML name table is removed from the current generational global XML name table. Removal can be in accordance with a garbage collection procedure or some other appropriate method. Processing from either process block 950 or process block 960 concludes at END block 970.

Figure 10:
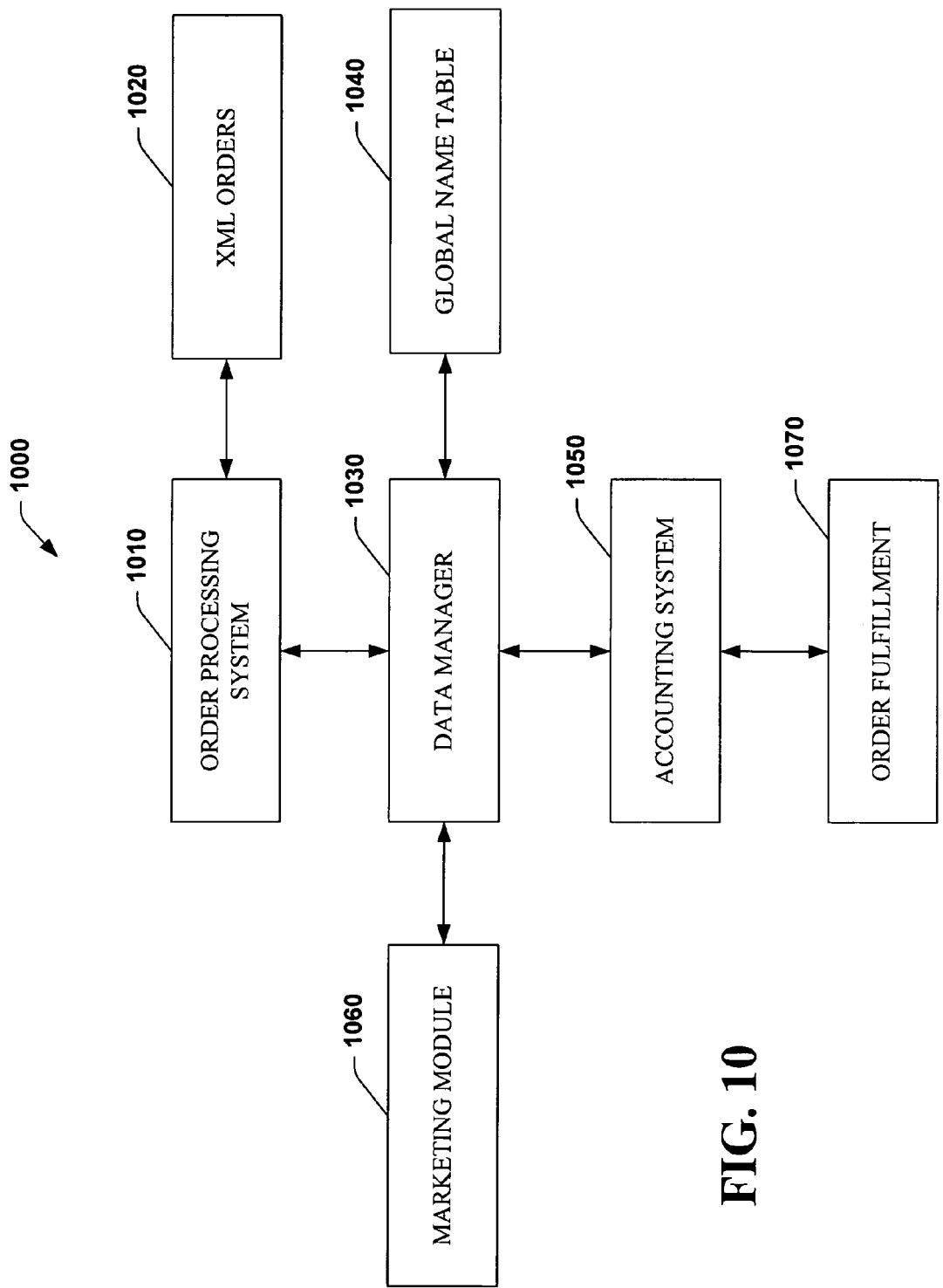
FIG. 10 is a system block diagram of an order transaction system that uses generational global name tables.

FIG. 10 is a system block diagram of a transaction processing system 1000. The transaction processing system 1000 can be used to process orders for goods that are in XML document format. Specifically, the transaction processing system 1000 can use data from the XML documents for various business-related computing tasks.

The transaction processing system 1000 can include an order processing system 1010. The order processing system 1010 can obtain XML-formatted orders 1020 from a variety of sources. These sources can include other connected systems or networks, specifically including the Internet or any of the types of networks previously disclosed or discussed in conjunction with other figures.

The order processing system can pass data from the XML orders 1020 to a data manager 1030. The data manager 1030 can use a generational global XML name table system 1040 to assist in processing order data. The data manager 1030 can pass relevant data about the orders to an accounting system 1050 and a marketing module 1060. The accounting system 1050 can perform standard accounting tasks such as debiting and crediting accounts, creating invoices, and billing, among others. The marketing module can perform various market- or customer-related tasks such as tracking demand and identifying sales trends, among others.

To perform marketing tasks, the marketing module, along with other components that have been disclosed or described herein, can use artificial intelligence-based components to assist in processing. Specifically, with regard to the marketing module 1060, an artificial intelligence based component can assist in identifying patterns in data, such as sales patterns and other customer behaviors. These tasks can be carried out by a neural network, an expert system, a rules-based processing component, or a support vector machine (SVM), among others.

A classifier is a function that maps an input attribute vector, $X=(x1, x2, x3, x4, \ldots xn)$, to a confidence that the input belongs to a class, that is, $f(X)=\text{confidence}(\text{class})$. Such a classification can employ a probabilistic and/or statistical-based analysis (for example, factoring into the analysis utilities and costs) to prognose or infer an action that a user desires to be automatically performed. In the case of an end-user programming module, patterns of events can be classified to determine whether to take one or more specified actions. Other patter-matching tasks can also be employed as will be evident to an artisan of ordinary skill upon reading this disclosure.

An SVM is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, for example, naïve Bayes, Bayesian networks, decision trees, and probabilistic classification models providing different patterns of independence can be employed. Classification as used herein also includes statistical regression that is utilized to develop models of priority.

As will be readily appreciated from the subject specification, components disclosed or described herein can employ classifiers that are explicitly trained (for example, by a generic training data) as well as implicitly trained (for example, by observing user behavior, receiving extrinsic information). For example, SVMs are configured by a learning or training phase within a classifier constructor and feature selection module. A trained component can be left to identify relevant patterns of interest in data submitted by other components.

Figure 11:
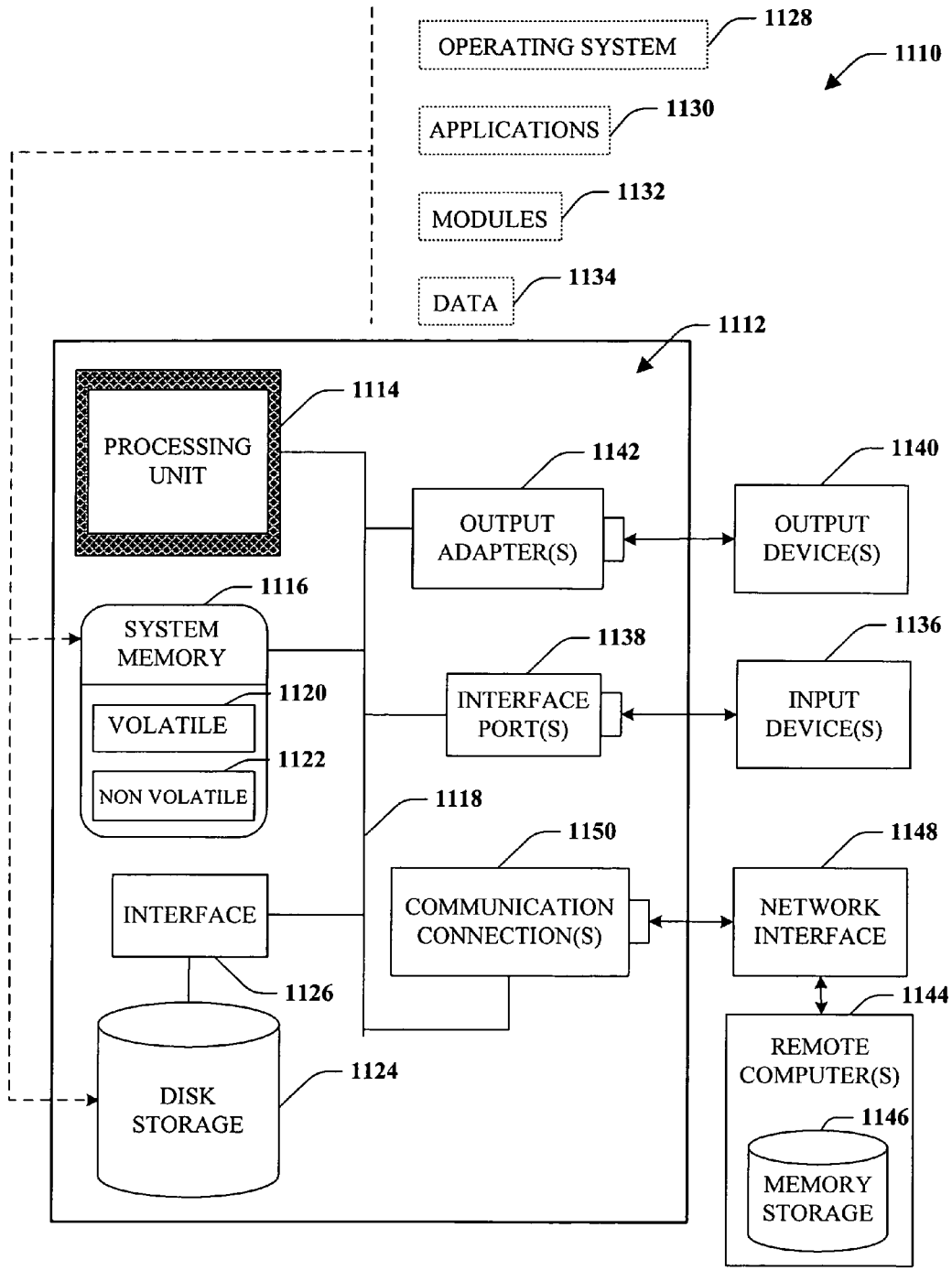
FIG. 11 is a block diagram of an exemplary computing environment.
Figure 12:
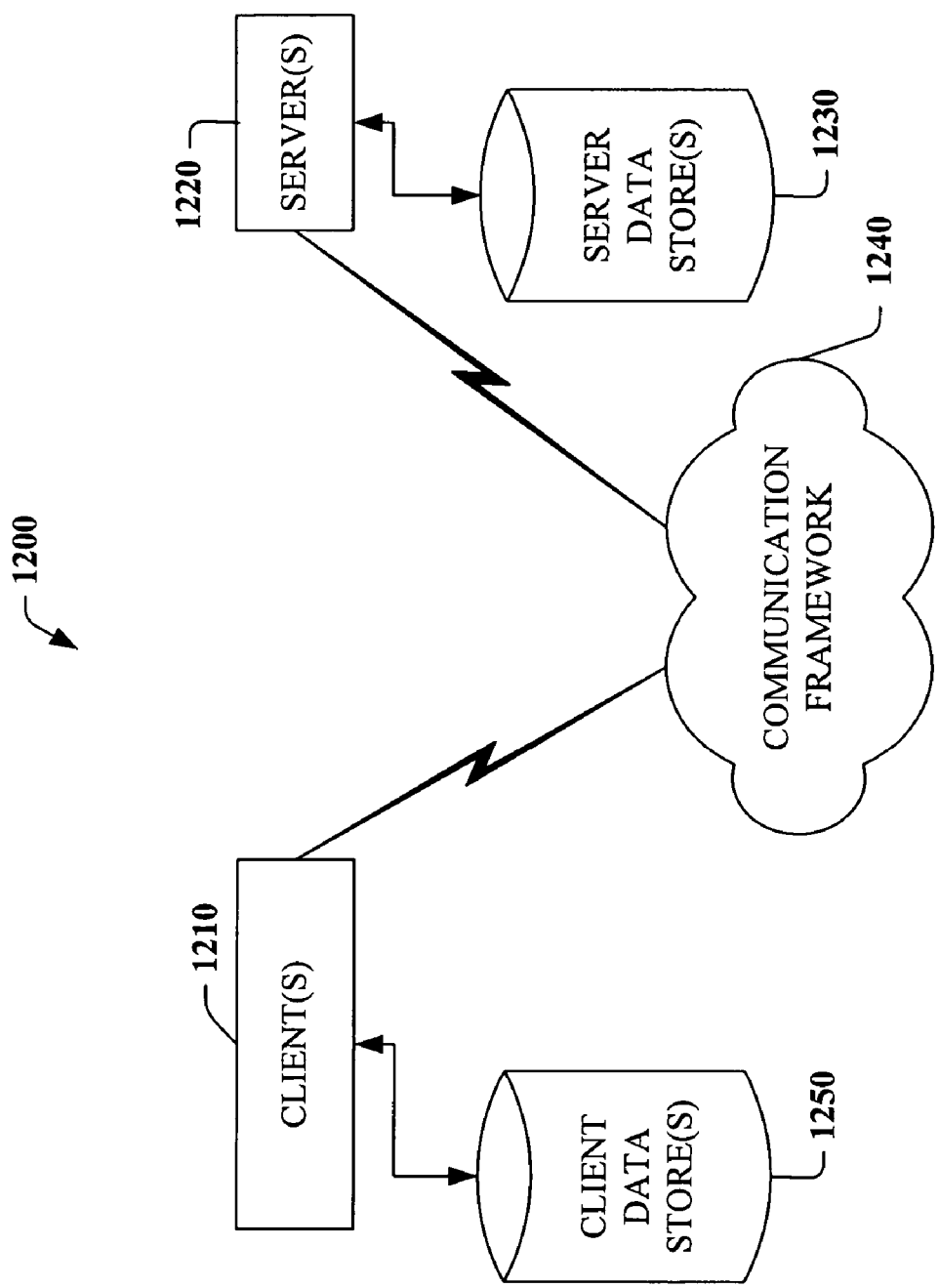
FIG. 12 is a system block diagram of an exemplary networking environment.

In order to provide additional context for implementation, FIGS. 11-12 and the following discussion is intended to provide a brief, general description of a suitable computing environment within which disclosed and described components and methods can be implemented. While various specific implementations have been described above in the general context of computer-executable instructions of a computer program that runs on a local computer and/or remote computer, those skilled in the art will recognize that other implementations are also possible either alone or in combination with other program modules. Generally, program modules include routines, programs, components, data structures, etc. that perform particular tasks and/or implement particular abstract data types.

Moreover, those skilled in the art will appreciate that the above-described components and methods may be practiced with other computer system configurations, including single-processor or multi-processor computer systems, minicomputers, mainframe computers, as well as personal computers, hand-held computing devices, microprocessor-based and/or programmable consumer electronics, and the like, each of which may operatively communicate with one or more associated devices. Certain illustrated aspects of the disclosed and described components and methods may also be practiced in distributed computing environments where certain tasks are performed by remote processing devices that are linked through a communications network or other data connection. However, some, if not all, of these aspects may be practiced on stand-alone computers. In a distributed computing environment, program modules may be located in local and/or remote memory storage devices.

With reference to FIG. 11, an exemplary environment 1100 for implementing various aspects of the invention includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multi-processor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable ROM (EEPROM), or flash memory. Volatile memory 1120 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1112 also includes removable/non-removable, volatile/non-volatile computer storage media. For example, FIG. 11 illustrates a disk storage 1124. The disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used such as interface 1126.

It is to be appreciated that FIG. 11 describes software that acts as an intermediary between users and the basic computer resources described in the suitable operating environment 1100. Such software includes an operating system 1128. The operating system 1128, which can be stored on the disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the subject invention can be implemented with various operating systems or combinations of operating systems.

A user enters commands or information into the computer 1112 through input device(s) 1136. The input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

FIG. 12 is a schematic block diagram of a sample-computing environment 1200 within which the disclosed and described components and methods can be used. The system 1200 includes one or more client(s) 1210. The client(s) 1210 can be hardware and/or software (for example, threads, processes, computing devices). The system 1200 also includes one or more server(s) 1220. The server(s) 1220 can be hardware and/or software (for example, threads, processes, computing devices). The server(s) 1220 can house threads or processes to perform transformations by employing the disclosed and described components or methods, for example.

One possible means of communication between a client 1210 and a server 1220 can be in the form of a data packet adapted to be transmitted between two or more computer processes. The system 1200 includes a communication framework 1240 that can be employed to facilitate communications between the client(s) 1210 and the server(s) 1220. The client(s) 1210 are operably connected to one or more client data store(s) 1250 that can be employed to store information local to the client(s) 1210. Similarly, the server(s) 1220 are operably connected to one or more server data store(s) 1230 that can be employed to store information local to the server(s) 1240.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A computer-implemented system for managing data element names that includes a memory coupled to a processor, comprising:

a source global name table that lists names of data elements encountered in processed XML documents, the source global name table includes a generation identifier, the source global name table is constrained such that the source global name table retains a primary predetermined number of entries; and a derived global name table that includes a subsequent generation identifier, the derived global name table is constrained such that the derived global name table retains a secondary number of entries, the derived global name table is constructed to list names of active data elements retained by the source global name table, the derived global name table is generated upon the source global name table reaching capacity, wherein each generation identifier designates a version of its respective global name table, wherein the secondary number of entries is larger than the primary predetermined number of entries and is calculated based at least in part upon the primary predetermined number of entries, and wherein the calculation of the secondary number of entries includes at least one of:

increasing the primary predetermined number of entries by a specified percentage, adding a preselected value to the primary predetermined number of entries, or increasing the primary predetermined number of entries by an amount that is sufficient to compensate for a rate of growth of the size of the source global name table.

2. The system of claim 1, wherein at least one of the names of data elements is associated with a generation identifier.

3. A method for managing data element names from extensible markup language documents, comprising:

using a source global name table that includes a first generation identifier to hold names of data elements encountered during processing of an extensible markup language document, the source global name table is constrained to a primary size; and creating a derived global name table that includes a second generation identifier subsequent to the first generation identifier, the derived global name table retains the names of data elements encountered during the processing of the extensible markup language document, the derived global name table includes names of active data elements retained by the source global name table, the derived global name table is constrained to a secondary size, wherein each generation identifier designates a version of its respective global name table, wherein creating the derived global name table includes setting a value for the secondary size that is at least as large as a value of the primary size, and wherein setting a value for the secondary size includes at least one of increasing the value of the primary size by a specified percentage, adding a preselected value to the value of the primary size, or increasing the value of the primary size by an amount that is sufficient to compensate for a rate of growth of the size of the source global name table.

4. The method of claim 3, further comprising associating a generation identifier with at least one of the names of the data elements.

5. The method of claim 3, further comprising removing the source global name table from use.

6. A system for managing data element names from extensible markup language documents that includes a memory coupled to a processor, comprising:

means for employing a source size-constrained global name table that includes a generation identifier to hold names of data elements encountered during processing of extensible markup language documents; and means for creating a derived size-constrained global name table that includes a secondary generation identifier to hold the names of data elements encountered during the processing of the extensible markup language documents, the means for creating a derived size-constrained global name table include means for migrating names of active data elements from the source size-constrained global name table, active data elements include data elements contained in extensible markup language documents currently processing, wherein each generation identifier designates a version of its respective global name table, wherein the means for creating the derived size-constrained global name table includes means for setting a size constraint value for the derived size-constrained global name table that is at least as large as a size constraint value of the source size-constrained global name table, and wherein the means for setting a size constraint value includes at least one of:

means for increasing a value of the size constraint value of the source size-constrained global name table by a specified percentage, means for adding a preselected value to a value of the size constraint value of the source size-constrained global name table, or means for increasing a value of the size constraint value of the source size-constrained global name table by an amount that is sufficient to compensate for a rate of growth of the size of the source size-constrained global name table.

7. The system of claim 6, further comprising means for associating a generation identifier with at least one of the names of the data elements.

8. The system of claim 6, further comprising means for removing the source size-constrained global name table from use.

9. The system of claim 8, further comprising means for eliminating the names of active data elements from the source size-constrained global name table upon migration to the derived size-constrained global name table.

10. The system of claim 9, means for removing the source size-constrained global name table comprises when the source size-constrained global name table only retains names of inactive data elements.

11. The system of claim 6, means for creating a derived size-constrained global name table comprises constructing the derived size-constrained global name table when the source size-constrained global name table grows to a predetermined size limit.

* * * * *

UNITED STATES PATENT AND TRADEMARK OFFICE
CERTIFICATE OF CORRECTION

| | | |
|---|---|---|
| PATENT NO. | : 7,454,436 B2 | Page 1 of 1 |
| APPLICATION NO. | : 11/215134 | |
| DATED | : November 18, 2008 | |
| INVENTOR(S) | : Henricus Johannes Maria Meijer et al. | |

It is certified that error appears in the above-identified patent and that said Letters Patent is hereby corrected as shown below:

In column 16, line 12, in Claim 6, delete "size- constrained" and insert -- size-constrained --, therefor.

Signed and Sealed this

Twenty-sixth Day of April, 2011

David J. Kappos
*Director of the United States Patent and Trademark Office*